United States Patent
Dillinger et al.

(10) Patent No.: US 6,865,709 B2
(45) Date of Patent: Mar. 8, 2005

(54) METHOD AND DEVICE FOR CHANNEL ENCODING IN AN INFORMATION TRANSFER SYSTEM

(75) Inventors: Markus Dillinger, München (DE); Peter Jung, Otterberg (DE); Jörg Plechinger, München (DE); Peter Schmidt, Erpolzheim (DE); Egon Schulz, München (DE); Markus Dötsch, Schliern (CH); Enric Mitjana, München (DE); Jürgen Schindler, Berlin (DE); Michael Schneider, München (DE)

(73) Assignee: Infineon Technologies AG, Munich (DE)

(*) Notice: Subject to any disclaimer, the term of this patent is extended or adjusted under 35 U.S.C. 154(b) by 507 days.

(21) Appl. No.: 10/112,270

(22) Filed: Mar. 28, 2002

(65) Prior Publication Data

US 2002/0131392 A1 Sep. 19, 2002

Related U.S. Application Data

(63) Continuation of application No. PCT/DE00/03348, filed on Sep. 22, 2000.

(30) Foreign Application Priority Data

Sep. 29, 1999 (DE) .......................... 199 46 721

(51) Int. Cl.[7] .............................................. H03M 13/03
(52) U.S. Cl. ........................................ 714/790; 714/786
(58) Field of Search ........................... 341/51; 375/130; 714/755, 762, 786, 790; 348/459

(56) References Cited

U.S. PATENT DOCUMENTS

| | | | | |
|---|---|---|---|---|
| 5,325,199 A | * | 6/1994 | Childs | 348/459 |
| 5,471,206 A | * | 11/1995 | Allen et al. | 341/51 |
| 5,636,242 A | * | 6/1997 | Tsujimoto | 375/130 |
| 5,721,745 A | * | 2/1998 | Hladik et al. | 714/755 |
| 6,105,159 A | * | 8/2000 | Frederickson | 714/762 |
| 6,298,463 B1 | * | 10/2001 | Bingeman et al. | 714/786 |
| 6,560,748 B2 | * | 5/2003 | Li | 714/786 |

FOREIGN PATENT DOCUMENTS

| | | |
|---|---|---|
| DE | 195 21 327 A1 | 12/1996 |
| DE | 197 36 653 C1 | 12/1998 |
| EP | 0 749 211 A2 | 12/1996 |
| EP | 0 820 159 A2 | 1/1998 |
| WO | 98/43383 | 10/1998 |
| WO | 00/74295 A1 | 12/2000 |

* cited by examiner

*Primary Examiner*—David Ton
(74) *Attorney, Agent, or Firm*—Laurence A. Greenberg; Werner H. Stemer; Gregory L. Mayback

(57) ABSTRACT

To achieve an improved disparate error protection in the transmission of coded symbols of an information stream, the information stream is supplied to a multiplicity of coding branches for coding, and is supplied in parallel, to a puncturing and multiplexing unit. Symbols of different quality classes are fed into each coding branch using a demultiplexer. An interleaver follows at least one demultiplexer for generating error protection for the filtered symbols. The symbols, which may possibly be interleaved, are coded in each coding branch and are supplied to the puncturing and multiplexing unit. The puncturing and multiplexing unit sets a predetermined coding rate.

7 Claims, 1 Drawing Sheet

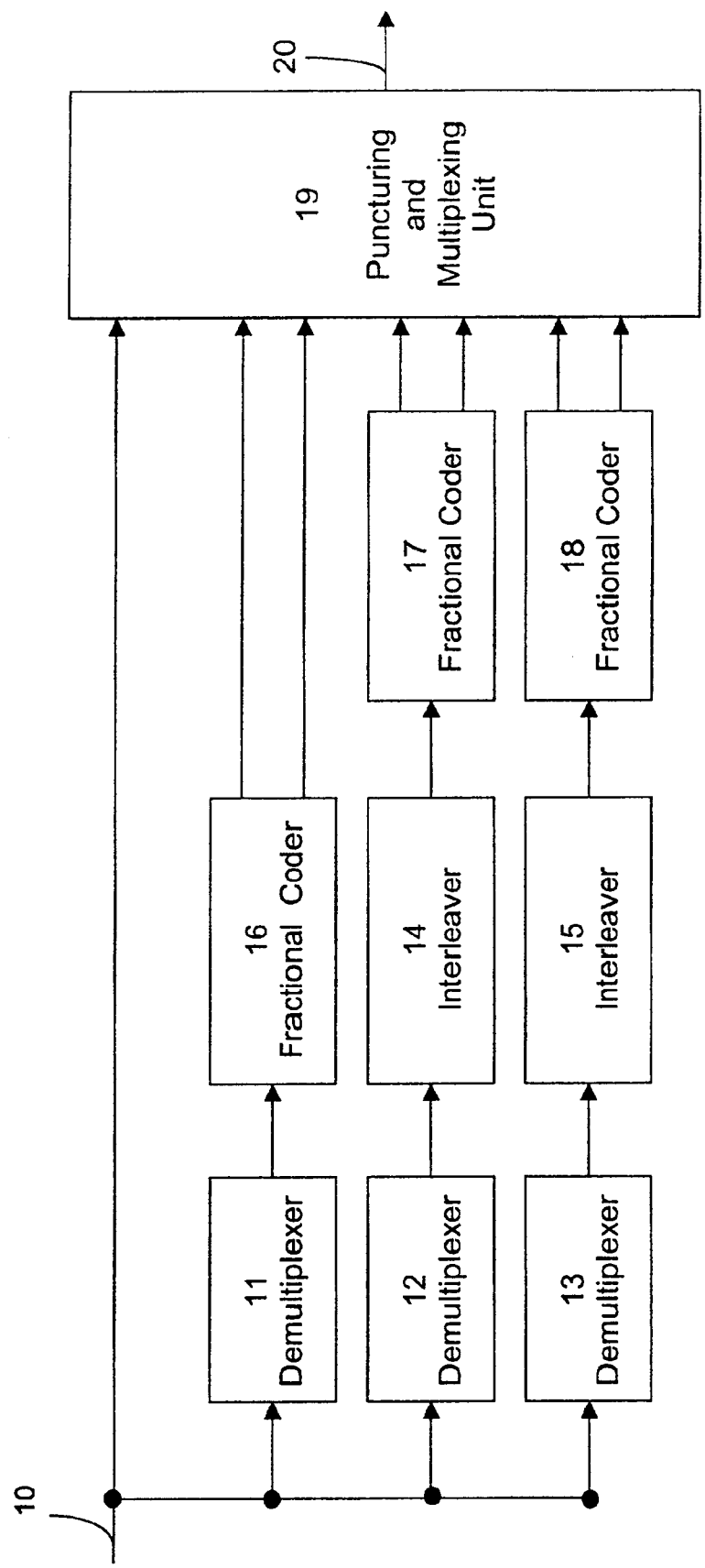

METHOD AND DEVICE FOR CHANNEL ENCODING IN AN INFORMATION TRANSFER SYSTEM

CROSS-REFERENCE TO RELATED APPLICATION

This application is a continuation of copending International Application No. PCT/DE00/03348, filed Sep. 22, 2000, which designated the United States.

BACKGROUND OF THE INVENTION

Field of the Invention

The invention relates to a method for channel coding in a message transmission system and to a device for carrying out the method.

To provide channel coding in message transmission systems, particularly, in mobile radio systems, disparate or unequal error protection is needed for achieving a corresponding transmission quality for protecting symbols, belonging to different quality classes, of an information stream that will be transmitted. The full-slot voice service, which needs good error protection to achieve high transmission quality, is mentioned here as an example only in second-generation mobile radio systems such as, for example, the GSM (Global System for Mobile Communication) standard.

In mobile radio systems according to the GSM standard, unequal error protection is achieved by using different codes and by concatenating these. However, a multiplicity of corresponding decoders is needed for decoding the different codes in the decoding process. With a corresponding circuit arrangement, this necessitates, in particular, a great implementation expenditure.

In Published European Patent Application EP 0 749 211 A2, a message transmission system is shown in which an information stream having symbols of different weighting is supplied to a number of coding branches arranged in parallel with one another. The information symbols are divided by using filters that are provided at the input of the coding branches. At the output of the coding branches, a common multiplexer unit is arranged which assembles the coded partial data streams.

Published European Patent Application EP 0 820 159 A2 also shows a multiplicity of coding branches arranged in parallel. The outputs of the coding branches are supplied to a multiplexer. A demultiplexer can be provided for distributing the information symbols to the coding branches. Furthermore, this document shows a puncturing unit that is connected in parallel with the multiplexer and that enables a desired code rate to be set.

International Publication WO 00/74295 A1 discloses a method and a device for flexible channel coding in which a demultiplexer is not provided at the input of a parallel arrangement of a number of coding branches.

SUMMARY OF THE INVENTION

It is accordingly an object of the invention to provide an apparatus for channel coding in a message transmission system and a method for channel coding in a message transmission system, which overcome the above-mentioned disadvantages of the prior art apparatus and methods of this general type.

In particular, it is an object of the invention to provide a method for channel coding in a message transmission that enables disparate error protection in the channel coding of symbols that will be transmitted via a message channel, especially via a mobile radio channel, in which little expenditure is needed for decoding the symbols.

With the foregoing and other objects in view there is provided, in accordance with the invention, a method for channel coding in a message transmission system, which includes the steps of: providing an information stream having symbols of different quality classes; supplying the information stream to a plurality of coding branches for coding; for each one of the plurality of the coding branches, using a respective demultiplexer to feed symbols of a respective one of the different quality classes of the information stream into the one of the plurality of the coding branches; providing at least a first one of the plurality of the coding branches with an interleaver for providing error protection for the symbols of at least a first one of the different quality classes; configuring the interleaver after the demultiplexer provided for the first one of the plurality of the coding branches such that the symbols of the first one of the different quality classes are interleaved; in each one of the plurality of the coding branches, coding the symbols of the respective one of the different quality classes to obtain coded symbols, the symbols of the first one of the different quality classes being interleaved before being coded; supplying the coded symbols from each one of the plurality of the coding branches in parallel to a puncturing and multiplexing unit; and setting a predetermined code rate with the puncturing and multiplexing unit.

In accordance with an added feature of the invention, the interleaver is a turbo code interleaver.

In accordance with an additional feature of the invention, in each one of the plurality of the coding branches, a fractional coder is used to code the symbols of the respective one of the different quality classes; and the fractional coder is a recursive systematic convolutional coder, a nonsystematic convolutional coder, or a block coder.

In accordance with another feature of the invention, a common coding rate is used in all of the fractional coders.

In accordance with a further feature of the invention, different coding rates are used in the plurality of the fractional coders.

With the foregoing and other objects in view there is also provided, in accordance with the invention, a device for channel coding in a message transmission system, that includes: a plurality of coding branches for receiving an information stream having symbols of different quality classes; a puncturing and multiplexing unit; and a plurality of fractional coders. Each one of the plurality of the coding branches has a demultiplexer for feeding the symbols of a respective one of the different quality classes of the information stream into that coding branch. At least a first one of the plurality of the coding branches includes an interleaver for providing error protection. The interleaver is configured after the demultiplexer in the first one of the plurality of the coding branches for interleaving the symbols of a first one of the different quality classes of the information stream. Each one of the plurality of the coding branches includes one of the plurality of the fractional coders for coding the respective one of the different quality classes of the information stream and for thereby obtaining coded symbols. The symbols of the first one of the different quality classes of the information stream are interleaved before being coded. The plurality of the fractional coders supply the coded symbols of the different quality classes of the information stream in parallel to the puncturing and multiplexing unit.

An essential point of the invention is dividing the symbols of the information stream that will be coded into different quality classes corresponding to the transmission quality that will be achieved, and providing a corresponding different coding of the symbols, i.e. coding with a different code rate (the code rate specifies the ratio between information data and information data and the test or correction data). In the case where symbols have a high quality class corresponding to a high transmission quality, coding takes place with a particularly high error protection, i.e. with a particularly low code rate, in the coding branch provided for this. In the inventive method, the puncturing and multiplexing unit is supplied with the information stream in parallel, so that it knows the systematology of the information stream and then processes the differently coded and error protected symbols from the individual coding branches, which have a different code rate, in such a manner that the different code rates are adapted to the transmission and the total code rate of a coded and error-protected information stream by puncturing. In particular, the desired total code rate can be set by appropriately puncturing using the puncturing and multiplexing unit.

The demultiplexers in the individual coding branches are used for feeding symbols of different quality classes into corresponding coding branches. To generate disparate error protection, symbols of higher quality classes, i.e. higher weighting, can be coded with a higher coding rate using three coders in a coding branch. Symbols of lower quality classes, i.e. lower weighting, can then be coded, for example, with a higher coding rate using two coders. In the puncturing and multiplexing unit, the differently coded symbols can then be brought to a common total code rate of, for example, ⅓ (higher weighting) or ½ (lower weighting). A common code rate is then set for the entire information stream by setting the total code rate in the puncturing and multiplexing unit even though the symbols of different quality classes contained in the information stream are correspondingly coded differently, i.e. have a different code or coding rate. Advantageously, an information stream with symbols of different quality classes can thus be processed without switching to and fro or over between different separate coders. The information stream is fed in parallel, as it were, into a multiplicity of different or even equal coder branches and assembled again to form an error-protected information stream in the puncturing and multiplexing unit. In particular, the interleaver or interleavers are turbo code interleavers. As a result, particularly good error protection is achieved, particularly in the case of large blocks of more than a thousand bits.

Preferably, in each coding branch, the possibly interleaved symbols are coded using a fractional coder. A fractional coder is a recursive systematic convolutional coder or non-systematic convolutional coder or block coder.

The fractional coders preferably have a common coding rate. Alternatively, the fractional coders can have a different coding rate.

Other features which are considered as characteristic for the invention are set forth in the appended claims.

Although the invention is illustrated and described herein as embodied in a method and device for channel encoding in an information transfer system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE shows a block diagram of a coder.

DESCRIPTION OF THE PREFERRED EMBODIMENTS

Referring now to the sole drawing FIGURE, there is shown a first illustrative embodiment of a coder. An information stream 10 that will be transmitted and coded includes data blocks having N bits. These N bits include N1 and N2 bits (N=N1+N2). The N2 bits belong to a first class, which is a higher quality class than that of the N1 bits. For example, the N2 bits can be used for transmitting important data such as, for example, security-related data (PIN, password) that require a high degree of error protection, and the N1 bits can correspond to voice data in which such a high degree of error protection is not needed.

Fewer bits of the first, high quality class are transmitted than that of the second, lower quality class so that N2<N1 holds true.

The information stream 10 to be transmitted and coded is supplied to a puncturing and multiplexing unit 19, which determines, for example, the number of symbols (in this case bits) of the different quality classes and their position in time and frequency by using the information stream. The puncturing and multiplexing unit 19 needs the structure of the information stream 10 for processing from the different coding branches.

The information stream is supplied in parallel to a first demultiplexer 11, a second demultiplexer 12, and a third demultiplexer 13. The demultiplexers 11–13 feed symbols of different quality classes of the information stream into the different coding branches. In the illustrative embodiment shown, three coding branches are provided for coding symbols.

The first demultiplexer 11 is followed by a first fractional coder 16, which codes symbols or bits, respectively, of the lowest quality class. The output signals of the first fractional coder 16 are supplied to the puncturing and multiplexing unit 19.

The second demultiplexer 12 and the third demultiplexer 13 are in each case followed by a first turbo code interleaver 14 and a second turbo code interleaver 15, respectively. The turbo code interleavers 14 and 15 rearrange and temporally spread the symbols or bits supplied. The turbo code interleaver influences the free distance of the turbo code that is used for coding the symbols.

The first and second turbo code interleaver 14 and 15, respectively, is in each case followed by a second fractional coder 17 and third fractional coder 18, respectively. The second fractional coder 17 and the third fractional coder 18 are each constructed as a recursive systematic convolutional coder (RSC coder). RSC coders are suitable for turbo codes, particularly in conjunction with turbo code interleavers. As an alternative, the second fractional coder 17 or the third fractional coder 18 can also be constructed as non-systematic convolutional coder (NSC coder) or as a block coder.

The output signals of the second fractional coder 17 and the third fractional coder 18, respectively, are supplied to the puncturing and multiplexing unit 19 which sets the total code rate and generates a coded and error-protected information stream 20 that has a disparate error protection and is simple to decode.

In a second illustrative embodiment (not shown), a device for carrying out the inventive method according exhibits a turbo code interleaver and two equal fractional coders. The turbo code interleaver has the size N=N1+N2. A disparate error protection is then achieved by differently puncturing the N1bits and the N2 bits.

In a third illustrative embodiment (not shown) a device for carrying out the inventive method exhibits two different fractional coders with a disparate code rate R1<R2. Furthermore, two demultiplexers and one turbo code interleaver are provided. The first fractional coder with the lower code rate R1 codes the N2 bits of the higher quality class and the second fractional coder with the higher code rate R2 codes the N1 bits with the lower quality class. As a result, a disparate code rate and a disparate error protection is achieved.

We claim:

1. A method for channel coding in a message transmission system, which comprises:

providing an information stream having symbols of different quality classes;

supplying the information stream to a plurality of coding branches for coding;

for each one of the plurality of the coding branches, using a respective demultiplexer to feed symbols of a respective one of the different quality classes of the information stream into the one of the plurality of the coding branches;

providing at least a first one of the plurality of the coding branches with an interleaver for providing error protection for the symbols of at least a first one of the different quality classes;

configuring the interleaver after the demultiplexer provided for the first one of the plurality of the coding branches such that the symbols of the first one of the different quality classes are interleaved;

in each one of the plurality of the coding branches, coding the symbols of the respective one of the different quality classes to obtain coded symbols, the symbols of the first one of the different quality classes being interleaved before being coded;

supplying the coded symbols from each one of the plurality of the coding branches in parallel to a puncturing and multiplexing unit; and setting a predetermined code rate with the puncturing and multiplexing unit.

2. The method according to claim 1, which comprises providing the interleaver as a turbo code interleaver.

3. The method according to claim 2, which comprises:

in each one of the plurality of the coding branches, using a fractional coder to code the symbols of the respective one of the different quality classes; and selecting the fractional coder from the group consisting of a recursive systematic convolutional coder, a nonsystematic convolutional coder, and a block coder.

4. The method according to claim 1, which comprises:

in each one of the plurality of the coding branches, using a fractional coder to code the symbols of the respective one of the different quality classes; and selecting the fractional coder from the group consisting of a recursive systematic convolutional coder, a nonsystematic convolutional coder, and a block coder.

5. The method according to claim 4, which comprises:

defining a plurality of fractional coders with the fractional coder in each one of the plurality of the coding branches; and using a common coding rate in the plurality of the fractional coders.

6. The method according to claim 4, which comprises:

defining a plurality of fractional coders with the fractional coder in each one of the plurality of the coding branches; and using different coding rates in the plurality of the fractional coders.

7. A device for channel coding in a message transmission system, comprising:

a plurality of coding branches for receiving an information stream having symbols of different quality classes;

a puncturing and multiplexing unit; and a plurality of fractional coders;

each one of said plurality of said coding branches having a demultiplexer for feeding symbols of a respective one of the different quality classes of the information stream into said one of said plurality of said coding branches;

at least a first one of said plurality of said coding branches including an interleaver for providing error protection;

said interleaver being configured after said demultiplexer in said first one of said plurality of said coding branches for interleaving the symbols of a first one of the different quality classes of the information stream;

each one of said plurality of said coding branches including one of said plurality of said fractional coders for coding the respective one of the different quality classes of the information stream and for thereby obtaining coded symbols, the symbols of the first one of the different quality classes of the information stream being interleaved before being coded; and said plurality of said fractional coders supplying the coded symbols of the different quality classes of the information stream in parallel to said puncturing and multiplexing unit.

* * * * *